United States Patent
Campbell et al.

(10) Patent No.: US 9,261,308 B2
(45) Date of Patent: Feb. 16, 2016

(54) PUMP-ENHANCED, SUB-COOLING OF IMMERSION-COOLING FLUID

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 341 days.

(21) Appl. No.: 13/671,857

(22) Filed: Nov. 8, 2012

(65) Prior Publication Data

US 2014/0124174 A1    May 8, 2014

(51) Int. Cl.
*F28D 15/00* (2006.01)
*H05K 7/20* (2006.01)
(Continued)

(52) U.S. Cl.
CPC .......... *F28D 15/02* (2013.01); *F28F 3/048* (2013.01); *F28F 3/12* (2013.01); *H05K 7/203* (2013.01);
(Continued)

(58) Field of Classification Search
CPC ....... H01L 23/42; H01L 23/427; H01L 23/44; H01L 23/473; F28D 15/02; F28D 15/00; H05K 7/203; H05K 7/20236; H05K 2/20272; H05K 7/20809; H05K 7/20772; F28F 3/048; F28F 2250/08; Y10T 29/49359
USPC ................ 165/104.22, 104.25, 104.28, 80.4
See application file for complete search history.

(56) References Cited

U.S. PATENT DOCUMENTS

| 5,907,473 A | 5/1999 | Przilas et al. |
| 5,924,482 A * | 7/1999 | Edwards et al. ......... 165/104.33 |

(Continued)

FOREIGN PATENT DOCUMENTS

| JP | 52016981 A * | 2/1977 |
| WO | WO 2010/019517 A1 | 2/2010 |

OTHER PUBLICATIONS

Campbell et al., Office Action for U.S. Appl. No. 13/780,613, filed Feb. 28, 2013 (U.S. Patent Publication No. 2014/0123492 A1), dated Jan. 29, 2015 (12 pages).

(Continued)

*Primary Examiner* — Tho V Duong
*Assistant Examiner* — Aaron Isenstadt
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses and methods of fabrication thereof are provided to facilitate two-phase, immersion-cooling of one or more electronic components. The cooling apparatus includes a housing having a compartment within which dielectric fluid is disposed which facilitates immersion-cooling of the electronic component(s). A liquid-cooled heat sink is associated with the housing and cools a cooling surface exposed within the compartment. One or more pumps are disposed within the compartment and configured to pump dielectric fluid liquid within the compartment towards the cooling surface to facilitate cooling the liquid within the compartment below a saturation temperature of the dielectric fluid. The heat sink includes or is coupled to condensing and sub-cooling regions exposed within the compartment.

15 Claims, 9 Drawing Sheets

(51) Int. Cl.
  *F28D 15/02* (2006.01)
  *F28F 3/04* (2006.01)
  *F28F 3/12* (2006.01)

(52) U.S. Cl.
  CPC ........ *H05K 7/20772* (2013.01); *H05K 7/20809* (2013.01); *F28F 2250/08* (2013.01); *Y10T 29/4935* (2015.01); *Y10T 29/49359* (2015.01)

(56) References Cited

U.S. PATENT DOCUMENTS

| | | | |
|---|---|---|---|
| 6,108,201 A * | 8/2000 | Tilton et al. | 361/689 |
| 7,184,269 B2 | 2/2007 | Campbell et al. | |
| 7,236,363 B2 | 6/2007 | Belady | |
| 7,284,389 B2 * | 10/2007 | Sharma et al. | 62/310 |
| 7,961,475 B2 | 6/2011 | Campbell et al. | |
| 8,014,150 B2 * | 9/2011 | Campbell et al. | 361/700 |
| 8,018,720 B2 * | 9/2011 | Campbell et al. | 361/700 |
| 8,059,405 B2 | 11/2011 | Campbell et al. | |
| 8,194,406 B2 * | 6/2012 | Campbell et al. | 361/698 |
| 2009/0080152 A1 | 3/2009 | Conn et al. | |
| 2010/0328889 A1 | 12/2010 | Campbell et al. | |
| 2010/0328891 A1 * | 12/2010 | Campbell et al. | 361/700 |
| 2011/0069453 A1 | 3/2011 | Campbell et al. | |
| 2011/0317367 A1 | 12/2011 | Campbell et al. | |
| 2014/0123492 A1 | 5/2014 | Campbell et al. | |

OTHER PUBLICATIONS

Ellsworth, Jr., Michael J., "High Powered Chip Cooling—Air and Beyond", Electronics Cooling, Aug. 1, 2005 (6 pages).

* cited by examiner

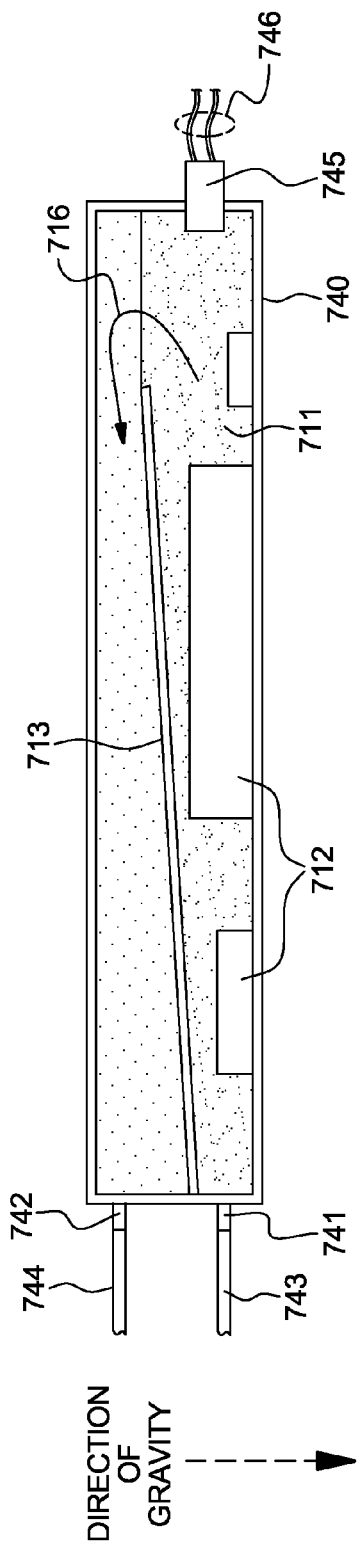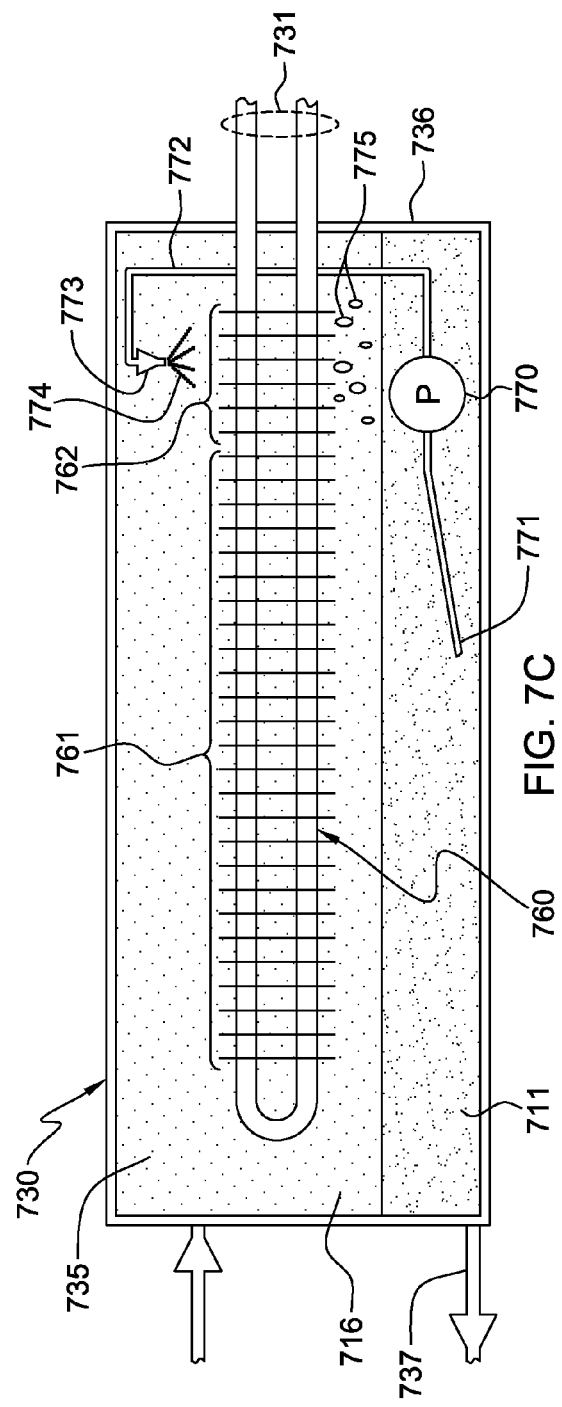

PUMP-ENHANCED, SUB-COOLING OF IMMERSION-COOLING FLUID

BACKGROUND

As is known, operating electronic components produce heat. This heat should be removed in order to maintain device junction temperatures within desirable limits, with failure to remove heat effectively resulting in increased component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density.

The need to cool current and future high heat load, high heat flux electronic devices therefore mandates the development of aggressive thermal management techniques, using liquid cooling. Various types of liquid coolants provide different cooling capabilities. For example, fluids such as refrigerants or other dielectric liquids (e.g., fluorocarbon liquid) exhibit lower thermal conductivity and specific heat properties compared to liquids such as water or other aqueous fluids. Dielectric liquids have an advantage, however, in that they may be placed in direct physical contact with electronic devices or components and their interconnects without adverse affects, such as corrosion or electrical short circuits. Other cooling liquids, such as water or other aqueous fluids, exhibit superior thermal conductivity and specific heat compared with dielectric fluids. Water-based coolants, however, must be kept from physical contact with electronic devices and interconnects, since corrosion and electrical short circuit problems are otherwise likely to result.

BRIEF SUMMARY

The shortcomings of the prior art are overcome and additional advantages are provided through, in one aspect, the provision of a cooling apparatus which includes a housing, a working fluid, a liquid-cooled heat sink, and at least one pump. The housing includes a compartment, and the working fluid is disposed within and at least partially fills the compartment. The working fluid facilitates cooling of at least one electronic component, and the liquid-cooled heat sink is associated with the housing and cools, at least in part by thermal conduction, a cooling surface exposed within the compartment. The one or more pumps are disposed within the compartment and configured to pump working fluid liquid within the compartment towards the cooling surface exposed within the compartment to facilitate sub-cooling of the working fluid liquid within the compartment below a saturation temperature of the working fluid.

In another aspect, a cooled electronic system is provided which includes one or more electronic components, at least partially immersion-cooled by a dielectric fluid, and a cooling apparatus. The cooling apparatus includes a housing, a liquid-cooled heat sink, and at least one pump. The housing includes a compartment, and the dielectric fluid is disposed within and at least partially fills the compartment. The liquid-cooled heat sink is associated with the housing and cools, at least in part by thermal conduction, a cooling surface exposed within the compartment. The at least one pump is disposed within the compartment and is configured to pump dielectric fluid liquid within the compartment towards the cooling surface exposed within the compartment to facilitate cooling of the dielectric fluid liquid within the compartment below a saturation temperature of the dielectric fluid.

In a further aspect, a method is provided which includes fabricating a cooling apparatus. Fabricating the cooling apparatus includes: providing a housing comprising a compartment; providing a working fluid disposed within and at least partially filling the compartment, the working fluid facilitating cooling of at least one electronic component; associating a liquid-cooled heat sink with the housing to cool, at least in part by thermal conduction, a cooling surface exposed within the compartment; and providing at least one pump within the compartment configured to pump working fluid liquid within the compartment towards the cooling surface exposed within the compartment to facilitate sub-cooling of the working fluid liquid within the compartment below a saturation temperature of the working fluid.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7B is a cross-sectional elevational view of an immersion-cooled electronic subsystem of the liquid-cooled electronics rack of FIG. 7A, in accordance with one or more aspects of the present invention; and FIG. 7C is a cross-sectional elevational view of the vapor condensing unit of the cooling apparatus depicted in FIGS. 7A & 7B, in accordance with one or more aspects of the present invention.

DETAILED DESCRIPTION

Figure 1:
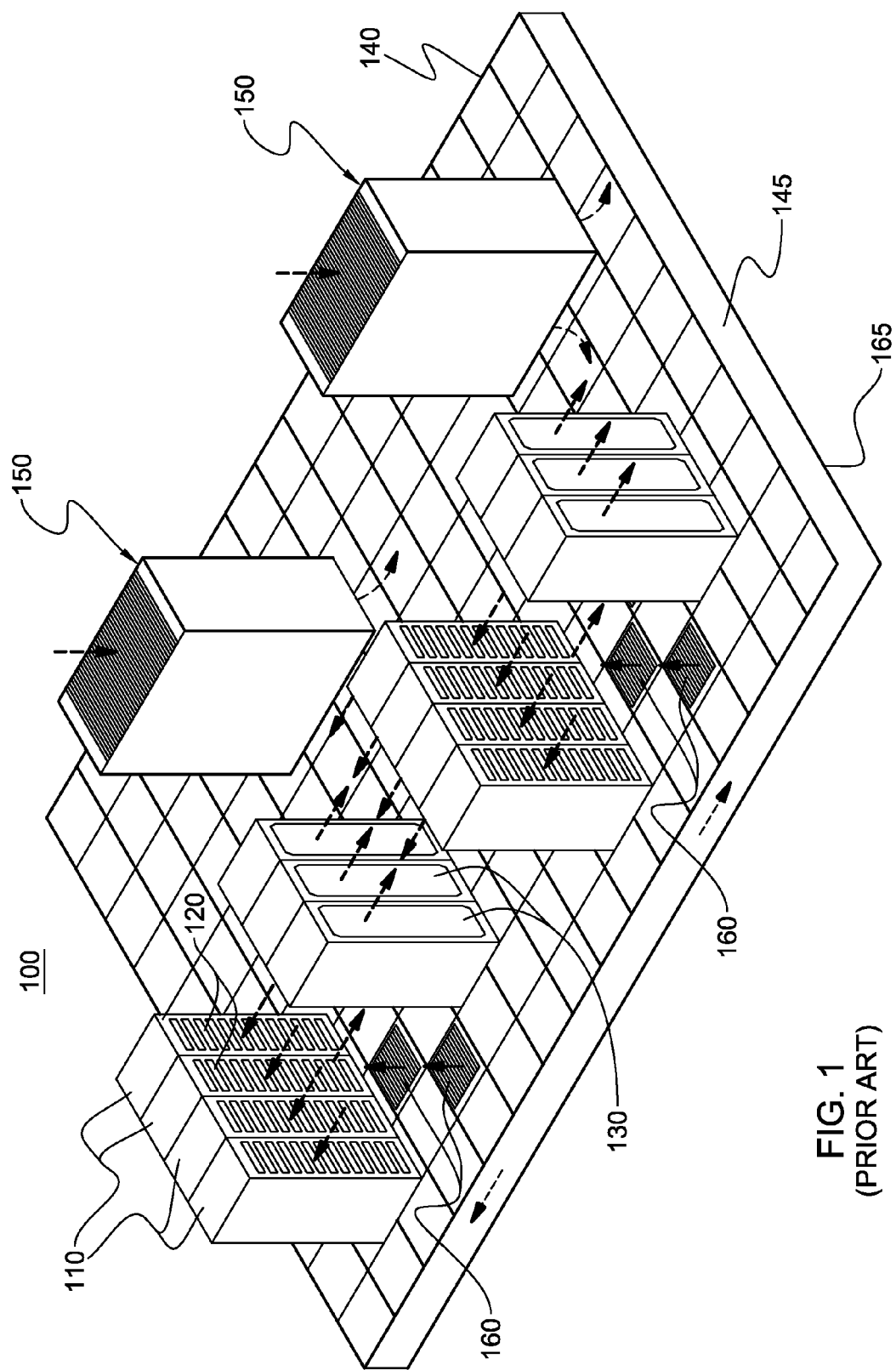
FIG. 1. depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high-, mid- or low-end processing capability. In one embodiment, an electronics rack may comprise one or more electronic subsystems. "Electronic subsystem" refers to any sub-housing, blade, book, drawer, node, compartment, board, etc., having one or more heat-generating electronic components disposed therein or thereon. An electronic subsystem of an electronics rack may be movable or fixed relative to the electronics rack, with the rack-mounted electronic drawers of a rack unit and blades of a blade center system being two examples of subsystems of an electronics rack to be cooled. In one embodiment, electronic subsystem refers to an electronic system or a portion of an electronic system which comprises multiple electronic components of the same or different types, and may be, in one example, a server unit.

"Electronic component" refers to any heat generating electronic component of, for example, an electronic system or other unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", or "liquid-cooled structure" each refer to any conventional thermally conductive structure having a plurality of channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing, for example, one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the backs, that is, air outlet sides 130, of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Figure 2:
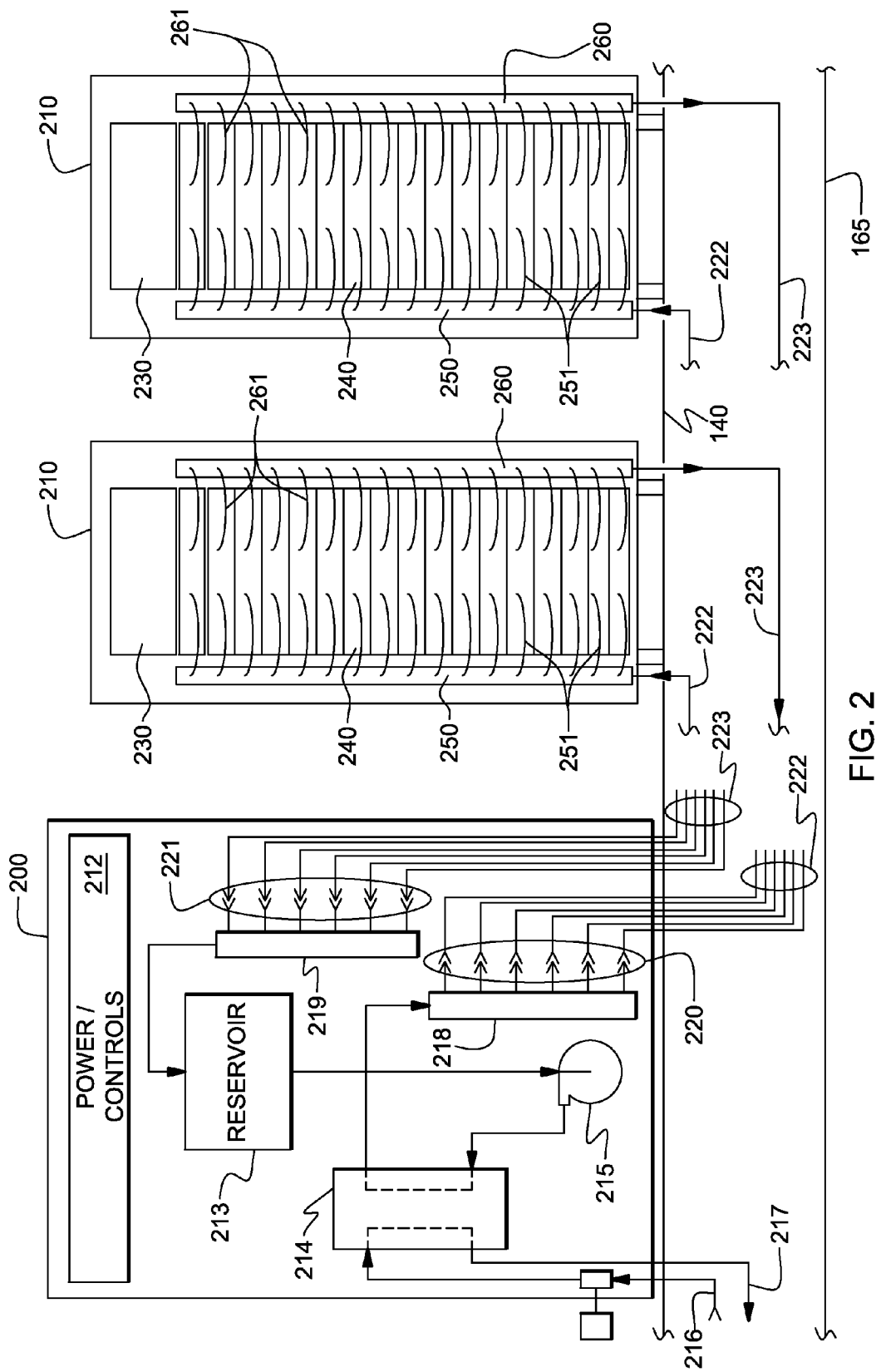
FIG. 2 depicts one embodiment of a coolant distribution unit facilitating liquid-cooling of electronics racks of a data center, in accordance with one or more aspects of the present invention.
Figure 3:
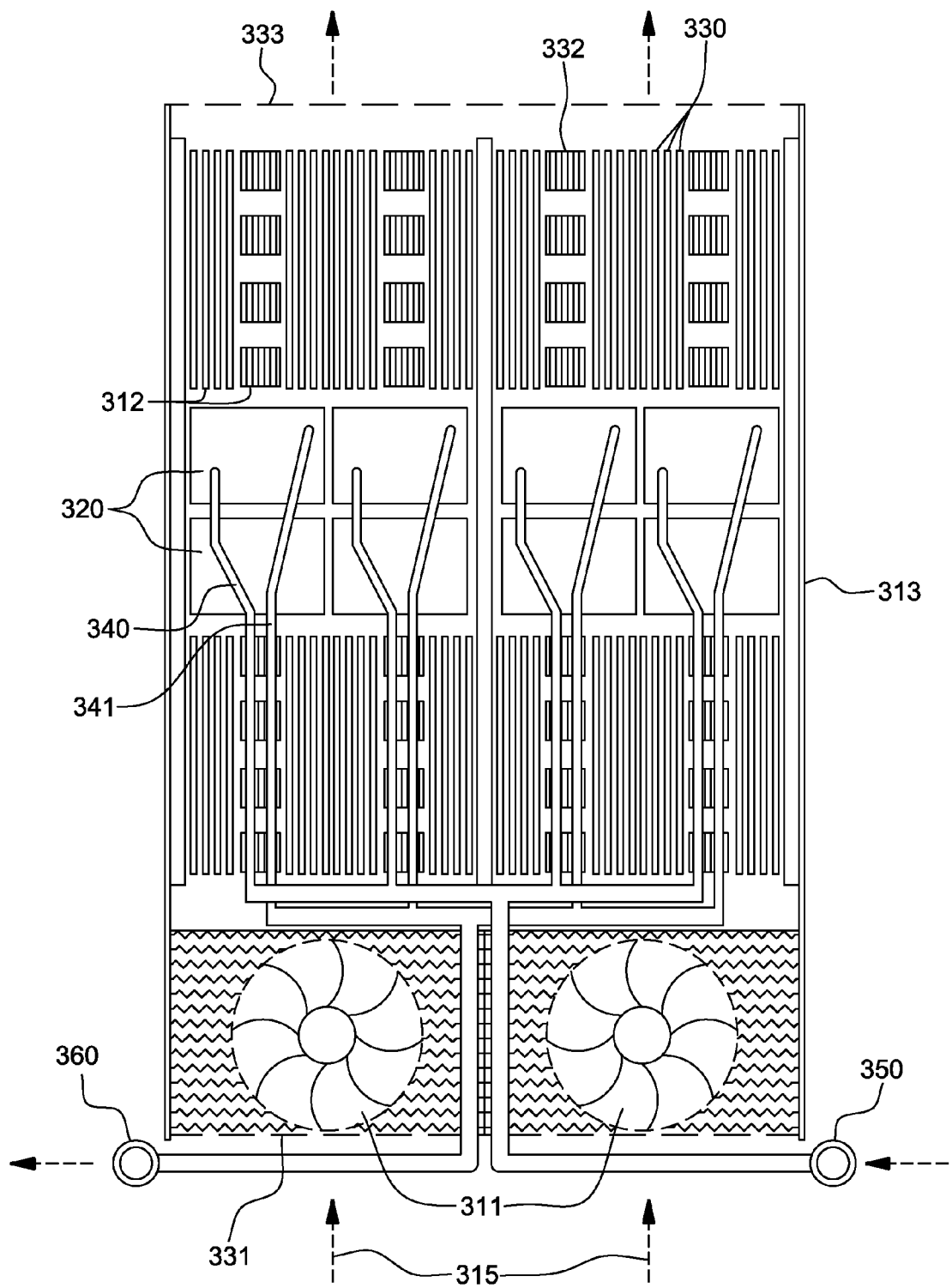
FIG. 3 is a plan view of one embodiment of an electronic subsystem (or node) layout, illustrating an air and liquid-cooling apparatus for cooling components of the electronic subsystem, in accordance with one or more aspects of the present invention.

Due to the ever-increasing airflow requirements through electronics racks, and the limits of air distribution within the typical data center installation, liquid-based cooling is being combined with the above-described conventional air-cooling. FIGS. 2-3 illustrate one embodiment of a data center implementation employing a hybrid air- and liquid-based cooling system with one or more cold plates coupled to high heat-generating electronic devices disposed within the electronics racks.

FIG. 2 depicts one embodiment of a coolant distribution unit 200 for a data center. Within coolant distribution unit 200 is a power/control element 212, a reservoir/expansion tank 213, a heat exchanger 214, a pump 215 (often accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic subsystems 240, a system coolant supply manifold 250, and a system coolant return manifold 260. In this embodiment, each electronics rack 210 is disposed on raised floor 140 of the data center, with lines 222 providing system coolant to system coolant supply manifolds 250 and lines 223 facilitating return of system coolant from system coolant return manifolds 260 shown disposed in the supply air plenum beneath the raised floor.

In the embodiment illustrated, the system coolant supply manifold 250 provides system coolant to the cooling systems of the electronic subsystems (more particularly, for example, to liquid-cooled cold plates thereof) via flexible hose connections 251, which are disposed between the supply manifold and the respective electronic subsystems within the rack. Similarly, system coolant return manifold 260 is coupled to the electronic subsystems via flexible hose connections 261. Quick connect couplings may be employed at the interface between flexible hoses 251, 261 and the individual electronic subsystems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic subsystem 313 component layout wherein one or more air moving devices 311 provide forced air flow 315 to cool multiple components 312 within electronic subsystem 313. Cool air is taken in through a front 331 and exhausted out a back 333 of the subsystem. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic subsystem 313, and partially arrayed near back 333 of electronic subsystem 313. Also, in the embodiment of FIG. 3, memory modules 330 and the memory support modules 332 are cooled by air flow 315 across the electronic subsystem.

The illustrated liquid-based cooling system further includes multiple coolant-carrying tubes 340, 341 connected to and in fluid communication with liquid-cooled cold plates 320. The coolant-carrying tubes 340, 341 comprise coolant supply tubes 340 and coolant return tubes 341, which are respectively in fluid communication with a system coolant supply manifold 350 and a system coolant return manifold 360. In this manner, system coolant is circulated through electronic subsystem 313, and in particular, liquid-cooled cold plates 320 thereof, to facilitate removal of heat from high-heat-generating components of the electronic subsystem, such as processor modules disposed within the subsystem.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic subsystem using pumped liquid, due to the density and number of components, such as controller chips, I/O components and memory modules. The small spaces and number of components to be cooled may make liquid plumbing a complex design and fabrication problem and raise the overall cost of the cooling solution.

Immersion-cooling is one possible solution to these issues. In immersion-cooling, one or more components to be cooled are immersed in a dielectric fluid that dissipates heat through boiling. The vapor is then condensed by a secondary, rack-level working fluid using node or module-level, vapor condensers, as explained below.

Direct immersion-cooling of one or more electronic components of an electronic subsystem of a rack unit using a working fluid (e.g., a dielectric fluid liquid) advantageously avoids forced air cooling and enables total liquid-cooling of the electronics rack within the data center. Although indirect liquid-cooling, such as described above in connection with FIGS. 2 & 3, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 2 & 3, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric fluid (employed in an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic components or electronic subsystems (e.g., of an electronics rack) may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

With immersion-cooled electronic systems, such as immersion-cooled electronic modules or immersion-cooled electronic subsystems, where pool-boiling of the dielectric fluid occurs, the dielectric fluid liquid within the compartment will approach the saturation temperature of the fluid. Disclosed herein therefore is a cooling apparatus which enhances two-phase immersion-cooling of one or more electronic components by providing one or more dedicated, immersed pumps within the compartment for facilitating heat transfer from the dielectric fluid liquid to sub-cool the dielectric fluid liquid below the fluid saturation temperature. Variations of the cooling apparatus are depicted in FIGS. 4-7C, including electronic module applications, as well as electronic subsystem and rack-level applications.

Generally stated, the cooling apparatus includes a housing (or casing) which at least partially defines a compartment. A working fluid is disposed within and at least partially fills the compartment, with the working fluid facilitating cooling of one or more electronic components. A liquid-cooled heat sink is associated with the housing and cools, at least in part by thermal conduction, a cooling surface exposed within the compartment. In addition, one or more pumps are disposed within the compartment and configured to pump working fluid liquid within the compartment towards the cooling surface exposed within the compartment to facilitate sub-cooling of the liquid within the compartment below a saturation temperature of the working fluid. This sub-cooling of the liquid is beneficial in a two-phase cooling approach. By driving the temperature of the working fluid liquid below the saturation temperature of the working fluid, enhanced cooling of the electronic component(s) is achieved.

Figure 4:
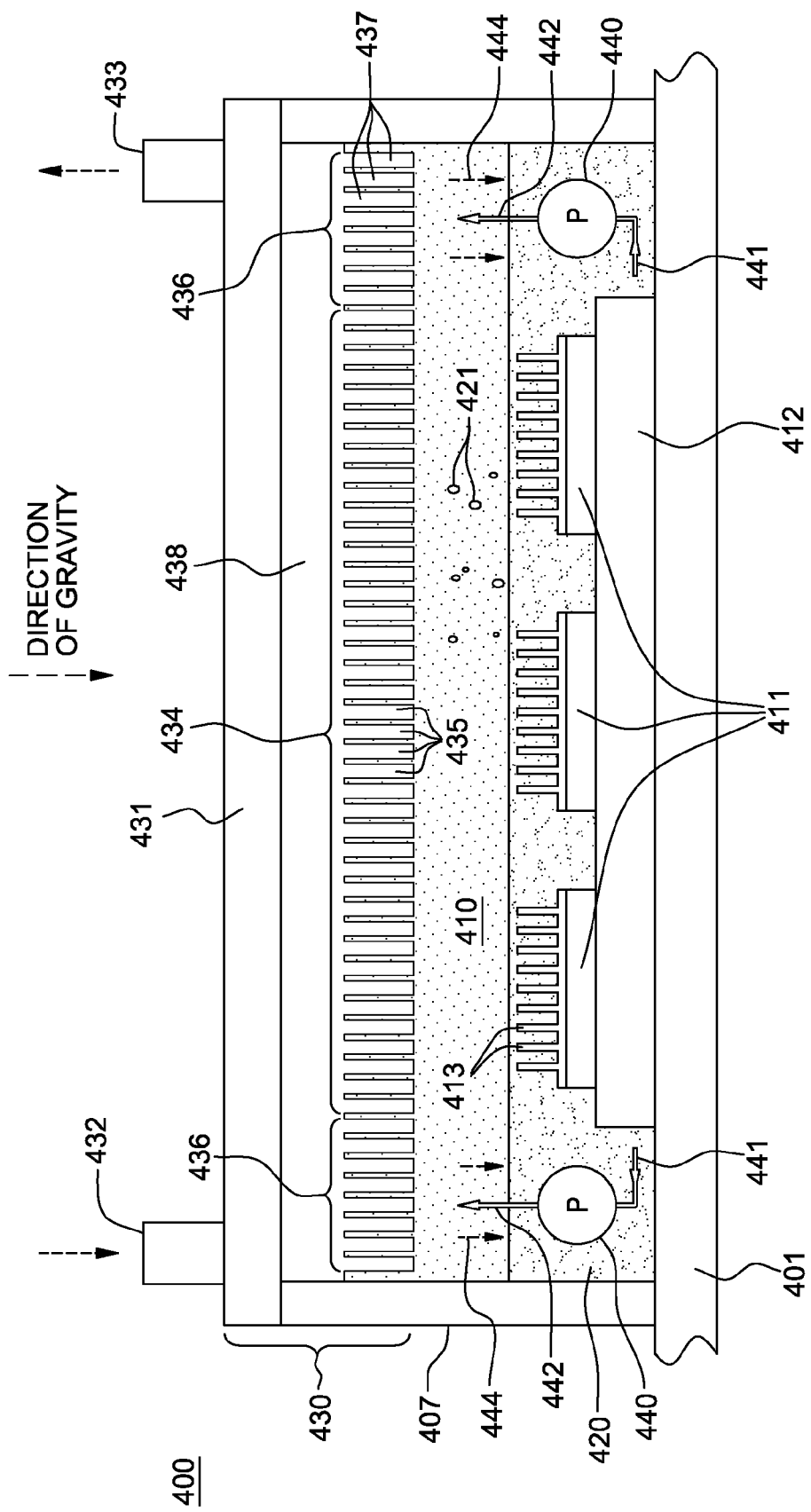
FIG. 4 depicts one embodiment of a cooled electronic system comprising a cooling apparatus, in accordance with one or more aspects of the present invention.

FIG. 4 depicts one embodiment of a cooled electronic system 400 comprising a cooling apparatus, in accordance with one or more aspects of the present invention. Cooled electronic system 400 is, by way of example, an immersion-cooled electronic module, with pump-enhanced sub-cooling of the working fluid liquid. By way of example, multiple electronic components 411, such as electronic chips or packages, are coupled to a printed circuit board 401 through a chip carrier or substrate 412. The electronic components 411 include, for instance, a plurality of thermally conductive, extended surfaces 413, which facilitate heat transfer and boiling of working fluid 420 within the illustrated compartment 410, within which the electronic components reside. Compartment 410 is defined (at least in part) by a housing (or casing) 407 which, in one embodiment, is mechanically coupled via a securing mechanism (not shown) to printed circuit board 401. In this embodiment, compartment 410 is a sealed compartment, and working fluid 420, such as a dielectric fluid, partially fills the compartment 410. Note that as used herein, and unless otherwise indicated, the word "substrate" refers to any underlying supporting structure, such as substrate 412 or printed circuit board 401, to which the electronic components are coupled, and to which the housing may be sealed in order to form a fluid-tight compartment 410 about the electronic components.

As depicted, the cooled electronic system 400 further includes a liquid-cooled heat sink 430, which comprises (by way of example only) a liquid-cooled cold plate 431 configured to allow a coolant, such as water, to flow therethrough. In this example, a coolant supply inlet 432 and coolant return outlet 433 are coupled in fluid communication with one or more coolant-carrying channels (not shown) within liquid-cooled cold plate 431 for convectively removing heat to the coolant (e.g., water) from a thermally conductive cover plate 438 of the system. In this example, thermally conductive cover plate 438 includes a central condenser region 434 comprising a plurality of thermally conductive condenser fins 435, and multiple sub-cooling regions 436, each comprising a plurality of thermally conductive sub-cooling fins 437. In this example, the sub-cooling regions 436 are, by way of example, disposed along the side walls of the housing. In operation, the plurality of thermally conductive condenser fins 435 facilitate condensing of dielectric fluid vapor rising into the upper region of the compartment 410.

In accordance with one or more aspects of the present invention, one or more pumps 440 are provided to direct dielectric fluid liquid 420 towards the sub-cooling regions 436 of, or thermally coupled to, liquid-cooled heat sink 430.

As illustrated, working fluid liquid is pumped by pumps 440 into the upper region of the compartment 410 to, in one embodiment, physically contact the respective sub-cooled regions 436, and in particular, to physically contact the plurality of sub-cooling fins 437 disposed within the sub-cooling regions, in order to cool the liquid below (for instance) a saturation temperature of the working fluid. Note that without active sub-cooling of the liquid, the working fluid will approach its saturation temperature. Each pump 440 may be, for instance, an impingement-cooling, immersed pump with a pump inlet tube 441, having an inlet at a lower region of the compartment for drawing working fluid liquid into the pump, and a pump outlet tube 442, which may optionally include a nozzle, for directing pressurized liquid towards the respective sub-cooling regions coupled to the liquid-cooled heat sink to facilitate cooling of the working fluid liquid. By way of specific example, the immersed pumps may each be an LPD-125 liquid pump, offered by AdaptivEnergy, LLC, of Hampton, Va., USA. In one implementation, the multiple pumps of this embodiment may be coupled to opposing side walls of the housing, and be positioned, sized, and configured to force pressurized liquid towards the sub-cooling regions 436 of the liquid-cooled heat sink, and thereby provide further cooling of the returning liquid 444 to a temperature below the saturation temperature of the working fluid.

When in operation, as dielectric fluid absorbs heat, it undergoes phase change from liquid phase to vapor phase, and thus utilizes its latent heat of vaporization for cooling purposes. The resultant dielectric fluid vapor rises to the upper region of the compartment, and the fluid vapor contacts the cool surfaces of the condenser fins 435 in the condensing region. As noted, the condensing fins are cooled by means of a thermal conduction coupling to liquid-cooled cold plate 431, and further by convection to coolant (such as water) passing through the liquid-cooled cold plate 431. By making contact with the cool condenser fins surfaces, the dielectric fluid vapor undergoes a second phase change process from vapor to liquid state, and the liquid droplets 421 fall downwards due to gravity and their relatively higher density compared with the neighboring vapor region. By way of example, the condenser fins 435 might comprise pin fin or plate fin structures. Further, depending on the implementation, the vertical length of the condenser fins may vary with, for instance, more centrally-disposed condenser fins being longer than the condenser fins disposed closer to the perimeter.

Dielectric liquid in the lower portion of the sealed compartment is simultaneously being drawn into the low-pressure side of the immersed pumps 440 via the pump inlet tubings 441. The pumps 440 direct dielectric fluid liquid 420 towards respective sub-cooling regions 436 of liquid-cooled heat sink 430 to sub-cool the returning liquid 444 to below the saturation temperature of the fluid. By lowering the temperature of the dielectric fluid liquid, enhanced heat transfer is provided at the boiling surfaces of the electronic components. Note that the plurality of sub-cooling fins 437 within the sub-cooling regions of the heat sink may be the same or differently-sized, positioned, or configured compared with the condenser fins 435 in the condenser region of the heat sink. Further, note that the pump outlet tubes 442 may be extended into the sub-cooling regions to facilitate impingement of the pumped dielectric fluid liquid onto the cooling surfaces of the fins in the sub-cooling regions. Note that if desired, one or more baffles, such as employed in the embodiment of FIG. 5 described below, may be employed within the chamber to facilitate physical separation between the pumped sub-cooling of dielectric fluid liquid and the condensing of the dielectric fluid vapor.

Further, note that the pumps may either force the dielectric fluid liquid through the sub-cooling fins, or alternatively, may force the dielectric fluid liquid at the sub-cooling regions, including the fins. In still another embodiment, the sub-cooling regions could comprise flat cooling surfaces, with the pumps jetting the dielectric fluid liquid to impinge upon the respective cooling surfaces. The goal is to drive the temperature of the returning dielectric fluid (or other working fluid within the compartment) down closer to the temperature of the coolant flowing through the liquid-cooled cold plate of the heat sink.

In the cooled electronic system embodiment of FIG. 4, the liquid-cooled cold plate portion of the heat sink is separable from the finned portion of the heat sink. An alternate configuration of the heat sink is depicted in FIG. 5.

Figure 5:
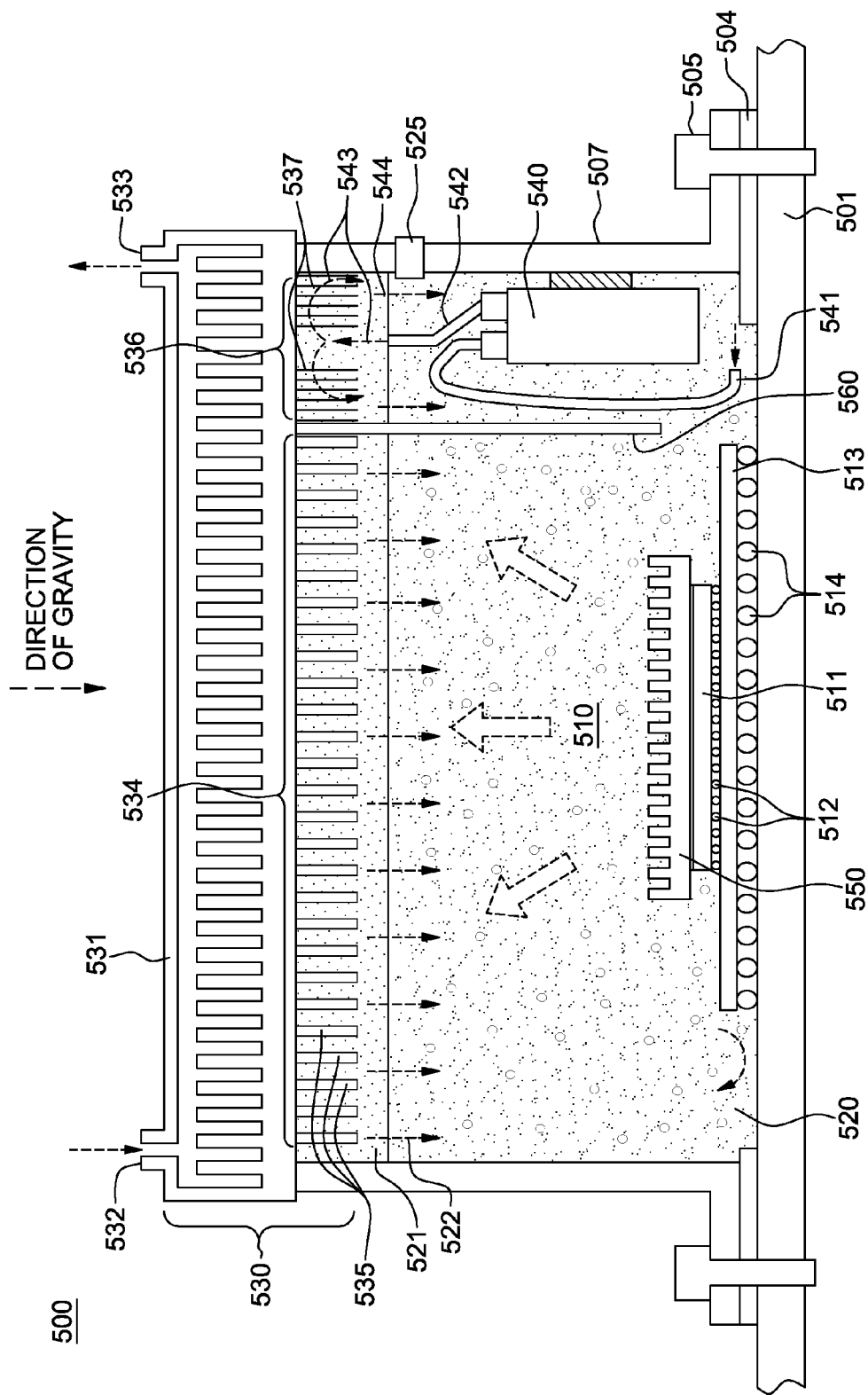
FIG. 5 depicts another embodiment of a cooled electronic system comprising a further implementation of a cooling apparatus, in accordance with one or more aspects of the present invention.

In FIG. 5, a different cooled electronic system 500, such as a cooled electronic module, is depicted by way of further example. Cooled electronic system 500 includes, in this embodiment, an electronic component 511, such as an electronic chip or package, coupled to a printed circuit board 501 through a chip carrier or substrate 513. A cooling apparatus comprising a housing (or casing) 507 is mechanically coupled via securing mechanisms 505 to board 501.

As shown, housing 507 is configured to at least partially surround and form a compartment 510 about electronic component 511 to be cooled. In this embodiment, electronic component 511 is connected to chip carrier (or substrate) 513 via, for instance, a first plurality of solder ball connections 512 and an underfill material (not shown). Substrate 513 is electrically connected to printed circuit board 501 via, for example, a second plurality of solder ball connections 514 (and an underfill material (also not shown)). The underfill material surrounding the first plurality of solder ball connections 512 seals the working fluid 520 within compartment 510 from the first plurality of electrical connections and (in one embodiment) an active surface of electronic component 511 disposed in spaced, opposing relation to substrate 513.

The housing 507 is (in one embodiment) a shell-like component that is attached to, for example, printed circuit board 501 using securing mechanisms 505, such as bolts or screws, and a sealing gasket 504, which is compressed between a lower surface of the housing and an upper surface of the board, or alternatively, between a lower surface of the housing and an upper surface of substrate 513, to which electronic component 511 directly couples. Sealing gaskets 504 seal off the compartment 510 of the housing, and assist in retaining the fluid within the compartment. Housing 507 includes, in the depicted embodiment, a fill port 525 to facilitate filling compartment 510 with working fluid 520.

As depicted, cooled electronic system 500 further includes a liquid-cooled heat sink 530, which comprises a coolant-cooled cold plate 531 with a plurality of channels through which a coolant, such as water, flows from a coolant inlet 532 to a coolant outlet 533. The liquid-cooled heat sink further includes a condenser region 534 comprising a plurality of condenser fins 535, and a sub-cooling region 536 comprising a plurality of sub-cooling fins 537.

In this embodiment, one or more baffles 560 partially extend from the upper region of the compartment towards the lower region to facilitate separating the condenser region 534 and the sub-cooling region 536 of the heat sink, and more particularly, to facilitate separating the dielectric fluid vapor condensing process from the dielectric fluid liquid sub-cooling process.

In the embodiment depicted, a pool of dielectric fluid liquid 520 resides over one or more electronic components 511 within the compartment in operational state. A boiling heat sink 550 may be attached to the electronic component(s) 511 to provide enhanced area for heat transfer. As the working liquid 520 absorbs heat, it undergoes phase change from liquid phase to vapor phase, and thus utilizes its latent heat of vaporization for cooling purposes. The dielectric fluid vapor generated travels upwards in the compartment due to the fact that it possesses a much lower density compared with the surrounding liquid. Upon reaching the upper portion of the compartment, the fluid vapor 521 contacts the cool vapor condensing surfaces of the thermally conductive condenser fins 535. Upon making contact with the cool, vapor condensing surfaces, the fluid vapor 521 undergoes a second phase change process from vapor to liquid state, and the liquid droplets 522 fall back downwards due to gravity, and the liquid's relatively higher density compared with the neighboring vapor region. As long as the boiling and condensation cooling processes are in equilibrium, and are commensurate with the heat generated by the one or more electronic components, the cooling apparatus depicted will successfully transport heat from the electronic component(s) to coolant flowing through the channels of the liquid-cooled cold plate.

In this embodiment, a single immersed pump 540 is illustrated facilitating sub-cooling of the dielectric fluid liquid within the compartment. As with the embodiment of FIG. 4, pump 540 may comprise an impingement-cooling, immersed pump, with a pump inlet tube 541 in a lower region of the compartment, and a pump outlet tube 542 in the upper region of the compartment. If desired, a jet nozzle (not shown) could be provided at the end of the pump outlet tube 542 for facilitating jet impingement of pressurized dielectric fluid liquid 543 onto the sub-cooling region 536 of the heat sink, which facilitates cooling of the dielectric fluid liquid 544, before returning to the lower region of the compartment. In the example of FIG. 5, pump 540 is mounted, by way of example, to a side wall of the housing (or casing) 507. Note also that, in this embodiment, the plurality of sub-cooling fins 537 in the sub-cooling region 536 of the heat sink are differently configured and spaced, by way of example, compared with the plurality of condenser fins 535 in the condenser region 534 of the heat sink.

As explained above, contemporaneous with the condensing process, dielectric fluid liquid in the lower portion of the sealed compartment is being drawn into the low-pressure side of pump 540 via the pump inlet tubing 541. Note that the partially submerged baffle 560 is configured to separate the vapor-rich region over the electronic component from the sub-cooling region of the heat sink. Improved heat transfer characteristics are obtained with a cooled electronic system 500, such as illustrated in FIG. 5, by actively reducing the temperature of the dielectric fluid liquid within the compartment, using the sub-cooling processing depicted and described herein.

FIGS. 4 & 5 depict two different versions of an immersion-cooled electronic module which provides a structural and thermal interface between the electronic component(s) being cooled and the liquid-cooled cold plate. FIG. 4 depicts (by way of example) an immersion-cooled, multi-chip module, while FIG. 5 depicts (by way of example) a single-chip module. In both embodiments, in operation, a pool of dielectric fluid resides over the electronic component(s). Fins may attach directly to the electronic component, or to a boiling heat sink, to enhance the heat transfer area to the working fluid. As the liquid absorbs heat, it undergoes phase change from liquid phase to vapor phase, and thus utilizes its latent heat of evaporation for cooling purposes. The vapor generated travels upwards in the module due to the fact that it possesses a much lower density compared with the surrounding liquid. Upon reaching the upper region of the module, the vapor comes in contact with the cool surfaces of the condenser fins. These condenser surfaces are cooled by means of thermal conduction through the finned material, and any base plate, to a liquid-cooled cold plate of the liquid-cooled heat sink. Upon making contact with the cool surfaces of the condenser fins, the vapor undergoes a second phase change process from vapor to liquid state, and the liquid droplets fall back downwards because of gravity, and their relatively higher density compared with the neighboring vapor region. The liquid at the lower region of the compartment participates in the boiling heat transfer at the electronic component surfaces to extract heat. Thus, as long as the boiling and condensing cooling processes are in equilibrium, and are commensurate with the heat generated by the components, the cooling apparatus successfully transports heat from the electronic component to the cold plate.

In both FIGS. 4 & 5 embodiments, the dedicated pumps are provided for sub-cooling the dielectric fluid liquid by drawing the liquid in and either spraying it or directing it for impingement on one or more cooling surfaces of the heat sink, or one or more surfaces in thermal conduction with the heat sink. This sub-cooling region of the cooling apparatus includes a cooling surface, which in combination with the pump configuration, is designed to facilitate lowering the temperature of the dielectric fluid liquid within the compartment; that is, to reduce the temperature of the liquid to lower then its saturation temperature for a given pressure inside the compartment. By producing a sub-cooled pool of liquid within the compartment, higher heat dissipation capability is provided at the electronic component, thereby enhancing cooling capability of the system.

As noted, the sub-cooling fins in the sub-cooling region of the heat sink may be of different geometry than the vapor condensing fins in the condenser region of the heat sink. For example, the vapor condensation heat transfer coefficient is likely larger than the heat transfer coefficient occurring at the interface between the liquid and the sub-cooling fins. This means that the vapor condensing fins can benefit from being thicker compared to the sub-cooling fins. The liquid film during condensation is likely much thinner than the liquid layer on the sub-cooling fins. Thus, the fin-to-fin gap for the condensation fins can be much smaller than for the sub-cooling fins. While a spray or injection-type configuration has been depicted and described above, the sub-cooling fins, and the liquid transport to and from the fins can be designed in a number of different ways, without departing from the scope of the invention.

Figure 6A:
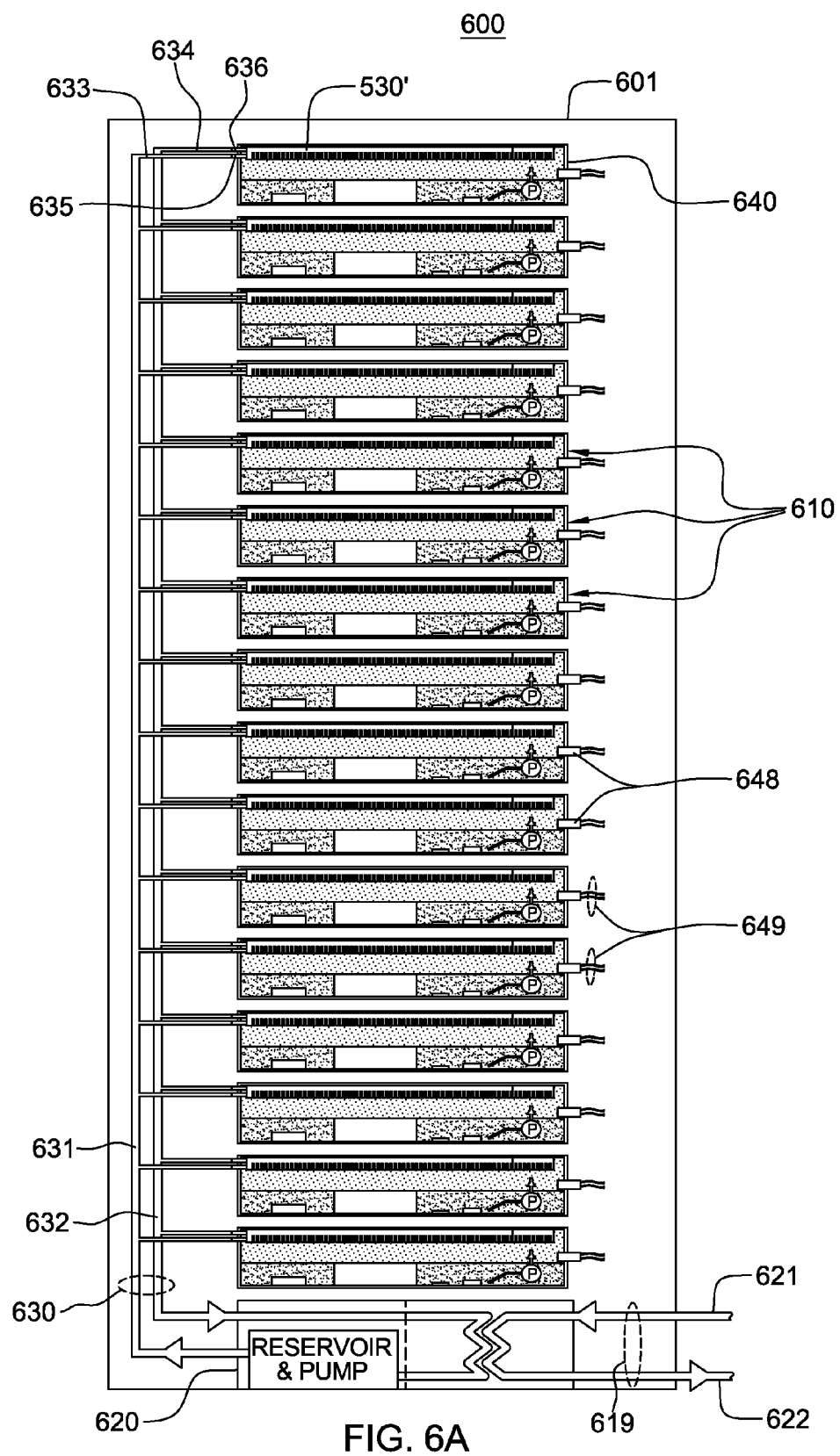
FIG. 6A is an elevational view of one embodiment of a cooled electronic system comprising a liquid-cooled electronics rack, with immersion-cooling of electronic subsystems thereof, and utilizing another embodiment of a cooling apparatus, in accordance with one or more aspects of the present invention.
Figure 6B:
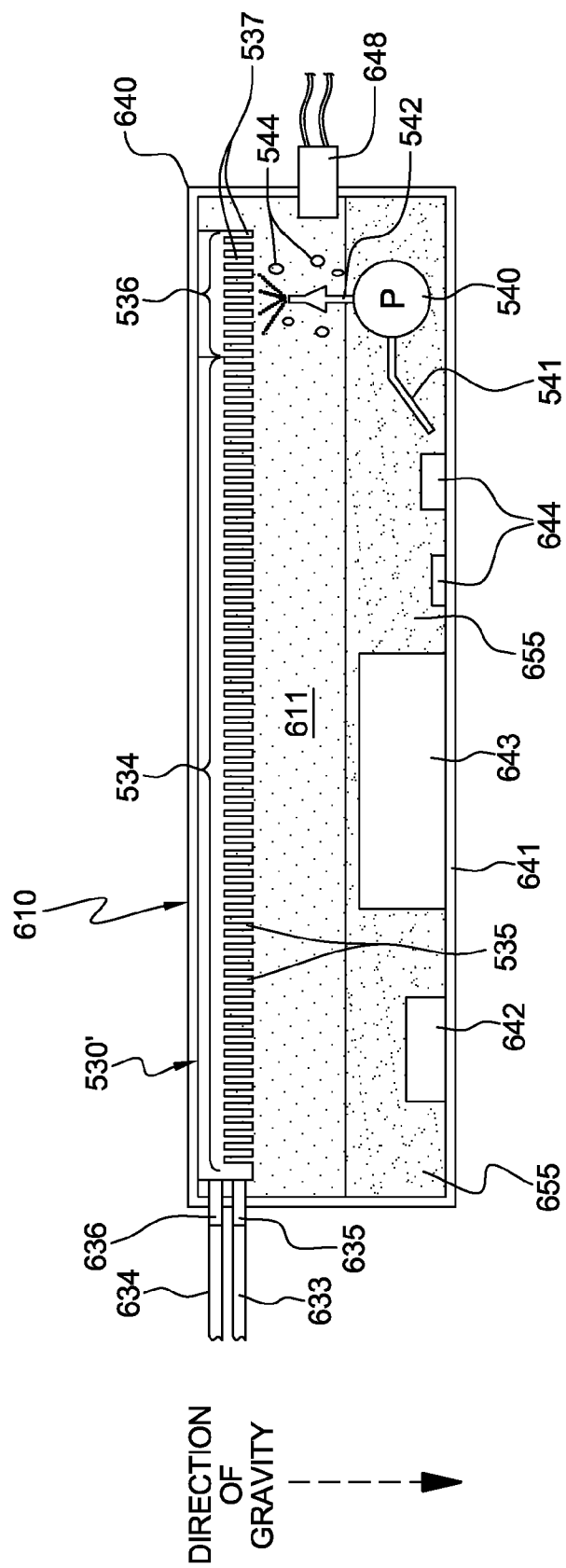
FIG. 6B is a cross-sectional elevational view of an immersion-cooled electronic subsystem of the liquid-cooled electronics rack of FIG. 6A, in accordance with one or more aspects of the present invention.

FIGS. 6A & 6B depict an alternate embodiment of a cooled electronic system, generally denoted 600, employing a cooling apparatus, in accordance with one or more aspects of the present invention. By way of example, this cooled electronic system illustrates multiple cooled electronic subsystems (or nodes), each of which has pump-enhanced, sub-cooled working fluid liquid within the respective compartments containing the subsystems or nodes.

Referring to FIG. 6A, the cooled electronic system 600 is shown to comprise a liquid-cooled electronics rack 601 employing immersion-cooling of electronic subsystems 610 disposed, in the illustrated embodiment, horizontally so as to be stacked within with rack. By way of example, each electronic subsystem 610 may be a server unit of a rack-mounted plurality of server units. In addition, each electronic subsystem includes multiple electronic components to be cooled, which in one embodiment, comprise multiple different types of electronic components, having different heights and/or shapes within the electronic subsystem.

The cooling apparatus is shown to include one or more modular cooling units (MCUs) disposed, by way of example, in a lower portion of electronics rack 601. The modular cooling unit(s) 620 includes, for instance, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. In one example, facility coolant supply and return lines 621, 622 couple modular cooling unit 620 to a data center facility coolant supply and return (not shown). Modular cooling unit 620 further includes an appropriately sized reservoir, pump, and optional filter for moving liquid coolant under pressure through system coolant loop 630. In one embodiment, system coolant loop 630 includes a coolant supply manifold 631 and a coolant return manifold 632, which are coupled to modular cooling unit 620 via, for instance, flexible hoses. In one example, coolant supply manifold 631 and coolant return manifold 632 each comprise an elongate, rigid tube vertically mounted to the electronics rack 601.

In the embodiment illustrated, coolant supply manifold 631 and coolant return manifold 632 are in fluid communication with respective coolant inlets 635 and coolant outlets 636 of individual sealed housings 640 containing the electronic subsystems 610. Fluid communication between the manifolds and the sealed housings is established, for example, via appropriately sized flexible hoses 633, 634. In one embodiment, each coolant inlet 635 and coolant outlet 636 of a sealed housing is coupled to a respective liquid-cooled heat sink 530' disposed within the sealed housing 640. Liquid-cooled heat sink 530' may be similar to the liquid-cooled heat sink 530 described above with reference to the embodiment of FIG. 5. Heat removed from the electronic subsystems 610 via the respective condenser and sub-cooling regions of the heat sinks is transferred via the system coolant flowing through the heat sinks to the coolant outlet manifold, and hence to the modular cooling unit, and then the facility coolant loop 619. In one example, coolant passing through the system coolant loop 630 is water. Also, note that, in general, fluidic coupling between the electronic subsystems and the coolant manifolds, as well as between the manifolds and the modular cooling unit(s), can be established using suitable hoses, hose barb fittings, and quick connect couplers. In one example, the vertically-oriented coolant supply and return manifolds 631, 632, each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of the housing and electronic subsystem from the electronics rack.

One or more hermetically sealed electrical connectors 648 may be provided in each sealed housing 640, for example, at a back surface thereof, for docking into a corresponding electrical plane of the electronics rack in order to provide electrical and network connections 649 to the electronic subsystem disposed within the sealed housing when the electronic subsystem is operatively positioned within the sealed housing, and the sealed housing is operatively positioned within the electronics rack.

As illustrated in FIG. 6B, electronic subsystem 610 includes a plurality of electronic components 642, 643, 644, of different height and type, on a substrate 641, and as shown, with the plurality of electronic components immersed within a dielectric fluid 655. Sealed housing 640 is configured to at least partially surround and form a sealed compartment about one or more electronic components of the electronic subsystem, with the components disposed within the sealed compartment. In an operational state, dielectric fluid 655 pools in the liquid state at the bottom of the sealed compartment, and is of sufficient volume to submerge the electronic components 642, 643, 644. The electronic components dissipate varying amounts of power, which cause the dielectric fluid liquid to boil, releasing dielectric fluid vapor, which rises to the upper portion of the compartment of the housing.

The upper portion of the housing 640 is shown in FIG. 6B to include a condenser region 534 comprising a plurality of vapor condensing fins 535. As noted, the condenser region of the heat sink may be similar to that described above in connection with FIGS. 4 & 5. In operation, dielectric fluid vapor contacts the cool, vapor-condensing surfaces of the condenser region, and condenses back to liquid phase, dropping downwards toward the lower region of the compartment. Coolant, such as water, is supplied to the liquid-cooled cold plate of the heat sink within the immersion-cooled electronic subsystem, and passes through the respective sets of coolant-carrying channels within the cold plate to cool, for instance, the vapor-condensing surfaces in the condenser region of the heat sink, as well as one or more cooling surfaces within a sub-cooling region 536 of the heat sink. In the embodiment depicted, sub-cooling region 536 includes a plurality of sub-cooling fins 537.

One or more pumps 540 are disposed within the compartments 611 of housing 640 to facilitate active pumping of dielectric fluid liquid (or other working fluid within the compartment) from a lower region of the compartment towards the sub-cooling region of the heat sink. In particular, pump 540 may include a pump inlet tube 541 and a pump outlet tube 542 for actively pumping dielectric fluid liquid within the compartment towards the sub-cooling region of the heat sink, for instance, into contact with a cooling surface of the sub-cooling region, to lower the temperature of the liquid within the compartment. As explained above, the temperature of the dielectric fluid liquid is lowered by this sub-cooling process to below a saturation temperature of the fluid in order to enhance the heat transfer characteristics of the fluid. Upon being sub-cooled, the cooler dielectric fluid liquid 544 falls from the upper region back to the lower region of the compartment, thereby reducing the temperature of the liquid within which the electronic components 642, 643, 644 are immersed.

Note that the size, configuration, and number of condenser fins and sub-cooling fins in the electronic subsystem embodiment of FIGS. 6A & 6B may differ from that of the cooled electronic module embodiments of FIGS. 4 & 5. However, the fins have similar function, as described above.

Figure 7A:
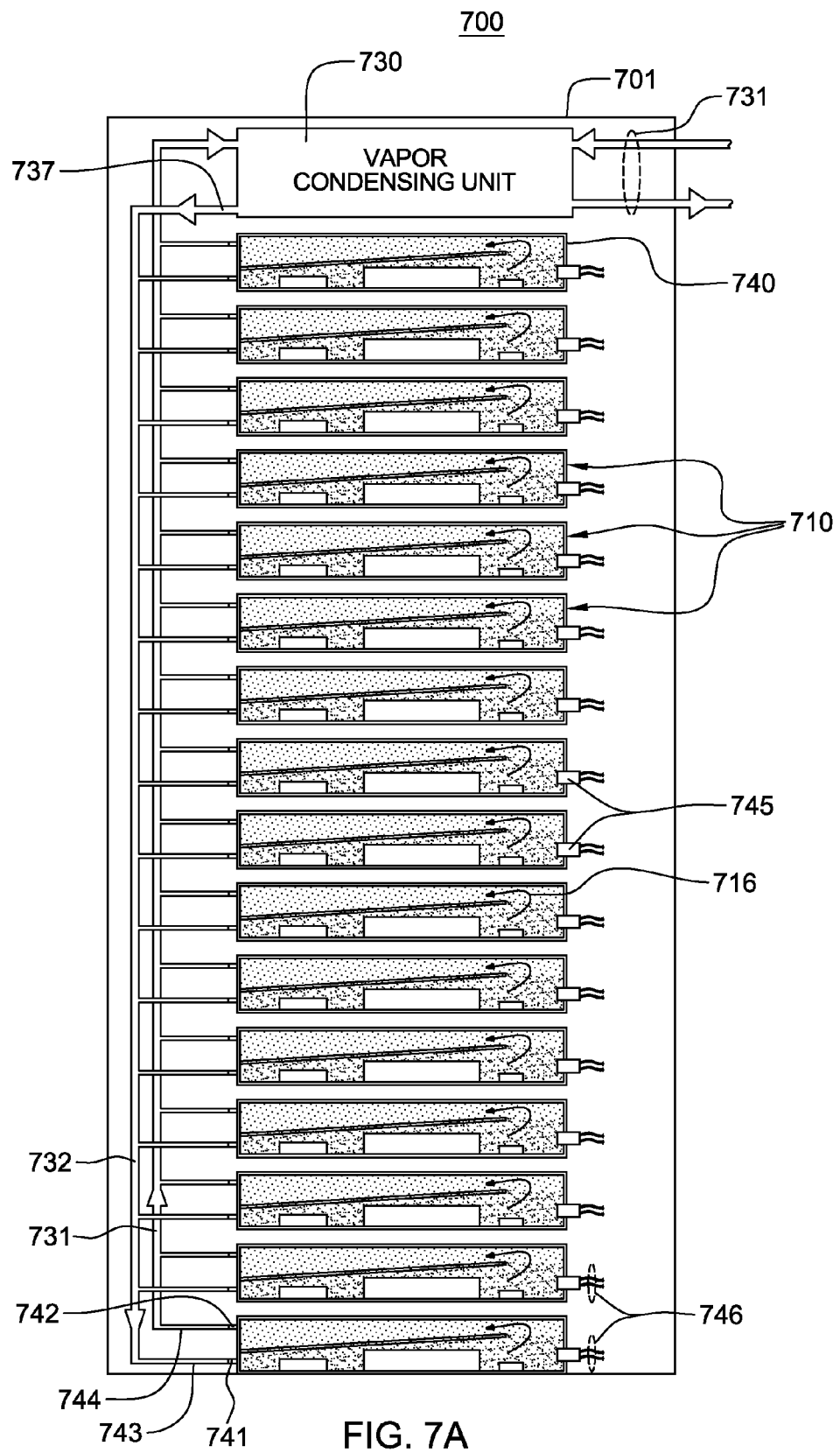
FIG. 7A is an elevational view of another embodiment of a cooled electronic system comprising a liquid-cooled electronics rack with immersion-cooling of electronic subsystems thereof, and utilizing a further embodiment of a cooling apparatus, in accordance with an aspect of the present invention.

FIGS. 7A-7C depict a further embodiment of a cooled electronic system, generally denoted 700, employing a cooling apparatus, in accordance with one or more aspects of the present invention. Referring collectively to FIGS. 7A-7C, the cooled electronic system 700 includes a liquid-cooled electronics rack 701 with a plurality of immersion-cooled electronic subsystems 710. In this implementation, the plurality of immersion-cooled electronic subsystems 710 are illustrated horizontally-disposed within the electronics rack 701 so as to be essentially stacked within the rack. By way of example, each electronic subsystem 710 may be a server unit of a rack-mounted plurality of server units, and include multiple electronic components 712 to be cooled. In one embodiment, each electronic subsystem comprises multiple different types of electronic components to be cooled having different heights and/or shapes.

The electronic subsystems 710 each comprise (in this example) a housing 740 at least partially surrounding and forming a sealed compartment about the electronic subsystem, with the plurality of electronic components 712 of the electronic subsystem being disposed within the compartment. In one example, electronic components 712 include one or more processors and one or more dual in-line memory (DIMM) arrays. A dielectric fluid liquid 711 is provided within the compartment, and the plurality of electronic components to be cooled are immersed within dielectric fluid liquid 711. A baffle 713 is provided to facilitate maintaining electronic components 712 immersed within the dielectric fluid liquid, and to divert flow of dielectric fluid vapor 716 generated by boiling of dielectric fluid at one or more surfaces of electronic components towards a dielectric fluid vapor outlet 742 disposed in an upper region of the compartment. As illustrated, the housing further includes a dielectric fluid inlet 741, through which dielectric fluid in liquid state is provided to the compartment. A dielectric fluid inlet line 743 and a dielectric fluid outlet line 744 couple to the respective dielectric fluid inlet 741 and dielectric fluid vapor outlet 742.

In an operational state, dielectric fluid pools in the liquid state 711 at the bottom of the compartment and, in one embodiment, is of sufficient volume to submerge the electronic components 712. Electronic components 712 dissipate varying amounts of power, which can cause the dielectric fluid to boil, releasing a dielectric fluid vapor 716, which rises to the upper region of the compartment of the housing.

One or more hermetically sealed electrical connectors 745 are also provided in each housing 740, for example, at a back surface thereof, for docking into a corresponding electrical plane (not shown) of the electronics rack 701 in order to provide electrical and network connections 746 to the electronic subsystem disposed within the housing when the electronic subsystem is operatively positioned within the housing, and the housing is operatively positioned within the electronics rack.

As illustrated in FIGS. 7A & 7B, dielectric fluid vapor outlet lines 744 couple in fluid communication dielectric fluid vapor outlets 742 of immersion-cooled electronic subsystems 710, and a dielectric fluid vapor return manifold 731. Dielectric fluid vapor return manifold 731 in turn couples in fluid communication the dielectric fluid vapor outlet lines 744 and a vapor-condensing unit 730 disposed in an upper portion of electronics rack 701. As illustrated in FIG. 7C, vapor-condensing unit 730 comprises, by way of example, a passive condensing unit which includes a liquid-cooled heat sink 760 disposed within a compartment 735 defined by a housing 736 of passive vapor-condensing unit 730. The liquid-cooled heat sink 760 is cooled by, for instance, facility coolant received via a facility coolant loop 731. The egressing dielectric fluid vapor from the respective immersion-cooled electronic subsystems condenses within the condensing unit to produce dielectric fluid liquid 711. This dielectric fluid liquid drops to the lower region of the condensing unit, which includes a condensate drain port 737 in fluid communication with a gravity drain line 732. Gravity drain line 732 directs dielectric fluid condensate via gravity to the immersion-cooled electronic subsystems 710 within the electronics rack 701.

Note that, in this embodiment, the facility coolant supplied to the liquid-cooled heat exchanger 760 within the vapor-condensing unit 730 needs to be at a temperature below the saturation temperature of the dielectric fluid. By way of example, if the facility coolant is water, a temperature of about 30° C., or higher, may be employed, based on the saturation temperature of the dielectric fluid within the cooled electronic system. Such a relatively high coolant temperature means that minimum cooling power is required to provide the facility coolant at the desired temperature to remove heat from the electronics rack.

As an enhancement, one or more sub-cooling pumps 770 are disposed within the vapor-condensing unit 730 to facilitate cooling of dielectric fluid liquid 711 below saturation temperature of the fluid. As in the embodiments described above, pump(s) 770 includes an associated pump inlet tube 771, and pump outlet tube 772, which facilitate pumping of the liquid from a lower region of the compartment 735 to an upper region, in this case above the liquid-cooled heat sink 760. By way of example, liquid-cooled heat sink 760 includes a vapor-condensing region 761, and a sub-cooling region 762, and in the embodiment illustrated, a plurality of thermally conductive condenser fins reside within the condenser region 761, and a plurality of thermally conductive sub-cooling fins reside within the sub-cooling region 762 of the liquid-cooled heat sink. The one or more pumps 770 pump dielectric fluid liquid to the upper region of the compartment, and a nozzle 773 provided at the outlet of the pump outlet tube 772 sprays dielectric fluid liquid 774 over the cooling surfaces of the sub-cooling region of the heat sink to lower the temperature of the liquid by producing sub-cooled condensate droplets 775, which drop back into the lower region of the condensing unit. Enhanced heat transfer characteristics are obtained, as explained above, by lowering the temperature of the dielectric fluid liquid below the saturation temperature of the fluid. Note that the size and configuration of the liquid-cooled heat sink structure may be different from that employed in the embodiments of FIGS. 4-6B. For example, the heat sink in the embodiment of FIGS. 7A-7C may be larger, and/or differently configured.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling apparatus comprising:
   a housing comprising a compartment;
   a working fluid disposed within and at least partially filling the compartment, the working fluid facilitating two-phase cooling of at least one electronic component, and during two-phase cooling, the working fluid comprises a working fluid liquid and a working fluid vapor within the compartment;
   a liquid-cooled heat sink associated with the housing and cooling, by at least in part thermal conduction, a condenser region and a sub-cooling region exposed within the compartment, the condenser region comprising a plurality of condenser fins extending into the compartment in an upper region thereof, the plurality of condenser fins facilitating condensing working fluid vapor in the upper region of the compartment, and the sub-cooling region comprising a plurality of sub-cooling fins extending into the compartment in the upper region thereof;
   at least one baffle extending downward within the compartment between the plurality of condenser fins of the condenser region and the plurality of sub-cooling fins of the sub-cooling region and separating the condenser region and the sub-cooling region; and
   at least one pump disposed within the compartment to pump the working fluid liquid within the compartment onto the plurality of sub-cooling fins of the sub-cooling region exposed within the compartment to facilitate sub-cooling of the working fluid liquid within the compartment below a saturation temperature of the working fluid, wherein the at least one baffle prevents pumped working fluid within the sub-cooling region from interfering with working fluid vapor condensing within the condenser region.

2. The cooling apparatus of claim 1, wherein the working fluid is a dielectric fluid comprising dielectric fluid liquid and dielectric fluid vapor, and the dielectric fluid liquid facilitates cooling the at least one electronic component by at least partial immersion-cooling thereof.

3. The cooling apparatus of claim 2, wherein the condenser region facilitates condensing of dielectric coolant vapor within the compartment, and the at least one pump pumps dielectric fluid liquid within the compartment onto the sub-cooling region to sub-cool the dielectric fluid liquid below the saturation temperature of the dielectric fluid.

4. The cooling apparatus of claim 1, wherein the at least one electronic component resides within the compartment of the housing.

5. The cooling apparatus of claim 1, wherein the plurality of condenser fins within the condenser region are thicker than the plurality of sub-cooling fins within the sub-cooling region.

6. The cooling apparatus of claim 1, wherein the plurality of condenser fins within the condenser region are differently spaced than the plurality of sub-cooling fins within the sub-cooling region.

7. The cooling apparatus of claim 2, wherein one pump of the at least one pump is an impingement-cooling, immersed pump disposed within the compartment and actively pumping dielectric fluid liquid drawn from a lower region of the compartment onto the plurality of sub-cooling fins of the sub-cooling region in the upper region of the compartment.

8. The cooling apparatus of claim 2, wherein the at least one baffle extends downward into the dielectric fluid liquid within the compartment to facilitate directing the dielectric fluid vapor within the compartment towards the condenser region and away from the sub-cooling region.

9. The cooling apparatus of claim 4, wherein the liquid-cooled heat sink comprises multiple sub-cooling regions, and the cooling apparatus comprises multiple pumps disposed within the compartment and configured to pump dielectric fluid liquid within the compartment towards respective sub-cooling regions of the multiple sub-cooling regions to facilitate cooling of the dielectric fluid liquid within the compartment below the saturation temperature of the dielectric fluid.

10. A cooled electronic system comprising:
   at least one electronic component at least partially immersion-cooled by a dielectric fluid;
   a cooling apparatus comprising:
      a housing comprising a compartment, the dielectric fluid at least partially filling the compartment, the at least one electronic component being disposed within the compartment, and two-phase cooled by the dielectric fluid, the dielectric fluid comprising a dielectric fluid liquid and a dielectric fluid vapor within the compartment;
      a liquid-cooled heat sink associated with the housing and cooling, at least in part by thermal conduction, a condenser region and a sub-cooling region exposed within the compartment, the condenser region comprising a plurality of condenser fins extending into the comparting in an upper region thereof, the plurality of condenser fins facilitating condensing the dielectric fluid vapor in the upper region of the compartment, and the sub-cooling region comprising a plurality of sub-cooling fins extending into the compartment in the upper region thereof;
      at least one baffle extending downward within the compartment between the plurality of condenser fins of the condenser region and the plurality of sub-cooling fins of the sub-cooling region and separating the condenser region and the sub-cooling region; and
      at least one pump disposed within the compartment to pump dielectric fluid liquid within the compartment onto the plurality of sub-cooling fins of the sub-cooling region exposed within the compartment to facilitate cooling of the dielectric fluid liquid within the compartment below a saturation temperature of the dielectric fluid, wherein the at least one baffle prevents pumped dielectric fluid liquid within the sub-cooling region from interfering with the dielectric fluid vapor condensing within the condenser region.

11. The cooled electronic system of claim 10, wherein the plurality of condenser fins within the condenser region are thicker than the plurality of sub-cooling fins within the sub-cooling region.

12. The cooled electronic system of claim 10, wherein the plurality of condenser fins within the condenser region are differently spaced than the plurality of sub-cooling tins within the sub-cooling region.

13. The cooled electronic system of claim 10, wherein one pump of the at least one pump is an impingement-cooling, immersed pump disposed within the compartment and actively pumping dielectric fluid liquid drawn from a lower region of the compartment onto the plurality of sub-cooling fins of the sub-cooling region in the upper region of the compartment.

14. The cooled electronic system of claim 10, wherein the at least one baffle extends downward in the dielectric fluid liquid within the compartment to facilitate directing dielectric fluid vapor within the compartment towards the condenser region and away from the sub-cooling region.

15. The cooled electronic system of claim 10, wherein the liquid-cooled heat sink comprises multiple sub-cooling regions, and the cooling apparatus comprises multiple pumps disposed within the compartment and configured to pump dielectric fluid liquid within the compartment towards respective sub-cooling regions of the multiple sub-cooling regions to facilitate cooling of the dielectric fluid liquid within the compartment below the saturation temperature of the dielectric fluid.

* * * * *